(12) United States Patent
Xi et al.

(10) Patent No.: US 12,040,175 B2
(45) Date of Patent: Jul. 16, 2024

(54) SEMICONDUCTOR STRUCTURE PROCESSING METHOD AND MANUFACTURING METHOD

(71) Applicant: Changxin Memory Technologies, Inc., Anhui (CN)

(72) Inventors: Ning Xi, Hefei (CN); Meng Zhu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 373 days.

(21) Appl. No.: 17/403,447

(22) Filed: Aug. 16, 2021

(65) Prior Publication Data

US 2022/0044924 A1 Feb. 10, 2022

Related U.S. Application Data

(63) Continuation of application No. PCT/CN2021/101410, filed on Jun. 22, 2021.

(30) Foreign Application Priority Data

Aug. 5, 2020 (CN) .......................... 202010776360.6

(51) Int. Cl.
*H01L 21/02* (2006.01)
*B08B 3/08* (2006.01)
(Continued)

(52) U.S. Cl.
CPC .......... *H01L 21/02057* (2013.01); *B08B 3/08* (2013.01); *H01L 21/0273* (2013.01); *H01L 21/30604* (2013.01); *H01L 21/308* (2013.01)

(58) Field of Classification Search
CPC ..................................... H01L 21/02041–02101
See application file for complete search history.

(56) References Cited

U.S. PATENT DOCUMENTS

| 10,811,247 B2 | 10/2020 | Ogihara et al. |
| 2003/0216269 A1* | 11/2003 | DeYoung ................. C11D 7/08 |
| | | 257/E21.255 |

(Continued)

FOREIGN PATENT DOCUMENTS

| CN | 102971835 A | 3/2013 |
| CN | 103283004 A | 9/2013 |

(Continued)

OTHER PUBLICATIONS

PCT International Search Report and the Written Opinion dated Sep. 26, 2021, issued in related International Application No. PCT/CN2021/101410, with English translation (11 pages).

(Continued)

*Primary Examiner* — Evan G Clinton
(74) *Attorney, Agent, or Firm* — Sheppard Mullin Richter & Hampton LLP

(57) ABSTRACT

This application relates to a semiconductor structure processing method, including: providing a semiconductor layer including a pattern, where a trench is located amongst the pattern; cleaning the pattern using a rinse liquid, where the rinse liquid fills the trench after the cleaning; forming a flexible layer, where the flexible layer displaces the rinse liquid and fills the trench, and covers a surface of the semiconductor layer; and hardening the flexible layer and subsequently removing the flexible layer.

20 Claims, 7 Drawing Sheets

(51) Int. Cl.
    *H01L 21/027*   (2006.01)
    *H01L 21/306*   (2006.01)
    *H01L 21/308*   (2006.01)

(56) References Cited

U.S. PATENT DOCUMENTS

2009/0311874 A1    12/2009  Tomita et al.
2012/0068246 A1     3/2012  Tanaka
2013/0104931 A1     5/2013  Arata et al.
2019/0088464 A1*    3/2019  Varaprasad ........... B08B 7/0085
2019/0267232 A1*    8/2019  Andreas ............ H01L 21/02057

FOREIGN PATENT DOCUMENTS

CN    108807140 A    11/2018
CN    109427579 A     3/2019

OTHER PUBLICATIONS

PCT International Preliminary Report on Patentability dated Feb. 16, 2023, issued in related International Application No. PCT/CN2021/101410, with English translation (11 pages).

* cited by examiner

SEMICONDUCTOR STRUCTURE PROCESSING METHOD AND MANUFACTURING METHOD

CROSS-REFERENCE TO RELATED APPLICATIONS

This application is a continuation application of International Patent Application No. PCT/CN2021/101410, filed on Jun. 22, 2021, which claims priority to Chinese Patent Application No. 202010776360.6, filed on Aug. 5, 2020. The above-referenced applications are incorporated herein by reference in their entirety.

TECHNICAL FIELD

This application relates to the field of semiconductor technologies, and in particular, to semiconductor structure processing and manufacturing methods.

BACKGROUND

As the semiconductor industry rapidly develops, technically, it is increasing focused on the pursuit of nanocomponents, and the feature size of semiconductor devices is constantly reduced as technology evolves toward shrinking the feature size. This is especially true in advanced dynamic random access memory (DRAM) manufacturing. In DRAM manufacturing, pattern collapse (e.g., chip structure collapse) can seriously affect chip yields and is increasingly becoming a key factor in the success or failure of the manufacturing process. In particular, for a pattern with a high aspect ratio, fluid tension per unit area of the pattern may be large. For example, a DRAM with a stacked capacitor architecture can have stacks of capacitors on a substrate that rises above the substrate and are densely packed. In this example, the stacks of capacitors may be subjected to fluid tensions, during cleaning, that may cause the stacks of capacitors to collapse. During the drying process when the pattern is cleaned, the surface of the pattern is subjected to various attractive and repulsive forces of chemicals of rinse liquids in various directions. When the sum of these forces exceeds the stretching limit of the pattern in a particular direction, unbalanced capillary forces may cause deformation or collapse of the pattern.

Conventional methods have been developed to address the problems discussed above. These conventional methods can reduce capillary forces of rinse liquids used to clean patterns of semiconductor devices during the drying process. Under one conventional method, capillary forces of the rinse liquid can be minimized by reducing or eliminating surface tension of the rinse liquid through a freeze drying process or a supercritical drying process. Under another conventional method, surface tension of the rinse liquid can be minimized by adding surfactants to the rinse liquid, including, for example, adding a supercritical carbon dioxide fluid to the rinse liquid to minimize capillary forces, thereby reducing chances of pattern collapse of semiconductor devices during a drying process.

However, there are many disadvantages associated with these conventional methods. For example, freeze drying of the rinse liquid can be complex and can take long time. As another example, stringent requirements imposed on devices used in supercritical drying of the rinse liquid can lead to high drying costs. Furthermore, as rinse liquids become more complex due to various additives (e.g., active agents) added to the rinse fluids, there may be residues from the additives that may adversely affect product yield of semiconductor devices.

SUMMARY

According to various embodiments of this application, a semiconductor structure processing method and manufacturing method are provided.

The semiconductor structure processing method includes: providing a semiconductor layer including a pattern, where a trench is located amongst the pattern; cleaning the pattern using a rinse liquid, where the rinse liquid fills the trench after the cleaning; forming a flexible layer, where the flexible layer displaces the rinse liquid and fills the trench, and covers a surface of the semiconductor layer; and hardening the flexible layer and subsequently removing the flexible layer.

The semiconductor structure manufacturing method includes: providing a semiconductor layer; performing patterning processing on the semiconductor layer to form a pattern on the semiconductor layer, where a trench is located amongst the pattern; and processing the semiconductor layer based on the semiconductor structure processing method.

BRIEF DESCRIPTION OF DRAWINGS

To describe the technical solutions in the embodiments of this application or in the prior art more clearly, the following briefly introduces the accompanying drawings required for describing the embodiments or the prior art. Clearly, the accompanying drawings in the following description merely show some embodiments of this application, and a person of ordinary skill in the art may still derive other drawings from these accompanying drawings without creative efforts.

Figure 1:
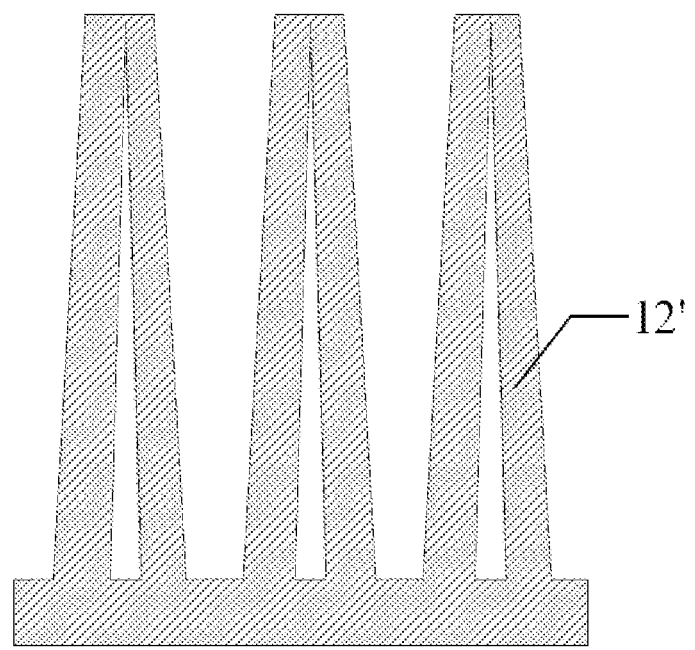
FIG. 1 illustrates a scenario in which a pattern of a semiconductor device collapsing during a drying process, according to an embodiment of this application.

Reference numerals: 10. semiconductor layer; 11. patterned mask layer; 12. pattern; 12'. pattern; 13. trench; 14. isopropanol; 20. flexible layer; 21. lower flexible layer; and 22. upper flexible layer.

DETAILED DESCRIPTION OF EMBODIMENTS

For ease of understanding of this application, the disclosure provided herein provides a comprehensive description of the invention(s) with references to accompanying drawings. Preferred embodiments are provided in the drawings. However, the disclosure provided herein may be implemented in many different forms and is not limited to the embodiments described herein. On the contrary, the purpose of providing these embodiments is to make the disclosure of this application more thorough and comprehensive.

Unless otherwise defined, all technical and scientific terms used herein have same meaning as those commonly understood by a person skilled in the art. The terms used herein are merely intended to describe specific embodiments and are not intended to limit the invention(s). The term "and/or" as used herein includes any and all combinations of one or more related listed items.

It should be understood that directions and/or positional relationships indicated by terms "up", "down", "vertical", "horizontal", "inside", "outside", and the like, are based on directions and/or positional relationships shown in relationship to the drawings, and are merely intended to describe the invention(s) and to simplify its disclosure. These terms are not intended to indicate or imply that an indicated apparatus or element shall have a specific direction or form in a specific direction, and therefore, shall not be understood as limitations.

FIG. 1 illustrates a scenario in which a pattern 12' of a semiconductor device collapsing during a drying process, according to an embodiment of this application. As discussed above, As the semiconductor industry rapidly develops, technically, it is increasing focused on the pursuit of nanocomponents, and the feature size of semiconductor devices is constantly reduced as technology evolves toward shrinking the feature size. This is especially true in advanced dynamic random access memory (DRAM) manufacturing. The scenario of FIG. 1 shows collapsing of the pattern 12' during a drying process. The collapse of the pattern 12' seriously affects chip yields and is increasingly becoming a key factor in determining whether a semiconductor fabrication process is a success or failure. The pattern 12' has a high aspect ratio. As such, fluid tension per unit area of the pattern 12' may be large. During a drying process when the pattern 12' is cleaned, the surface of the pattern 12' is subjected to various attractive and repulsive forces of chemicals of rinse liquids in various directions. When the sum of these forces exceeds a stretching limit of the pattern 12' in a particular direction, unbalanced capillary forces may cause deformation or collapse of the pattern 12'.

Conventional methods have been developed to address the problems discussed above. These conventional methods can reduce capillary forces of rinse liquids used to clean patterns of semiconductor devices during a drying process. For example, in one conventional method, to reduce collapsing of the pattern 12 caused by capillary forces of a rinse liquid can be minimized by reducing or eliminating surface tension of the rinse liquid through a freeze drying process or supercritical drying process. As another example, in another conventional method, surface tension of a rinse liquid can be minimized by adding surfactants to the rinse fluid, including, for example, adding a supercritical carbon dioxide fluid to the rinse liquid to protect integrity of the pattern 12'.

However, there are many disadvantages associated with these conventional methods. For example, freeze drying of a rinse liquid can be complex and can take long periods of time. As another example, stringent requirements imposed on devices used in supercritical drying of a rinse liquid can lead to high drying costs. Furthermore, as rinse liquids become more complex due to various additives (e.g., active agents) added to the rinse fluids, residues from the additives may accumulate on the surface of the pattern 12', which may affect product yield rates.

Figure 2:
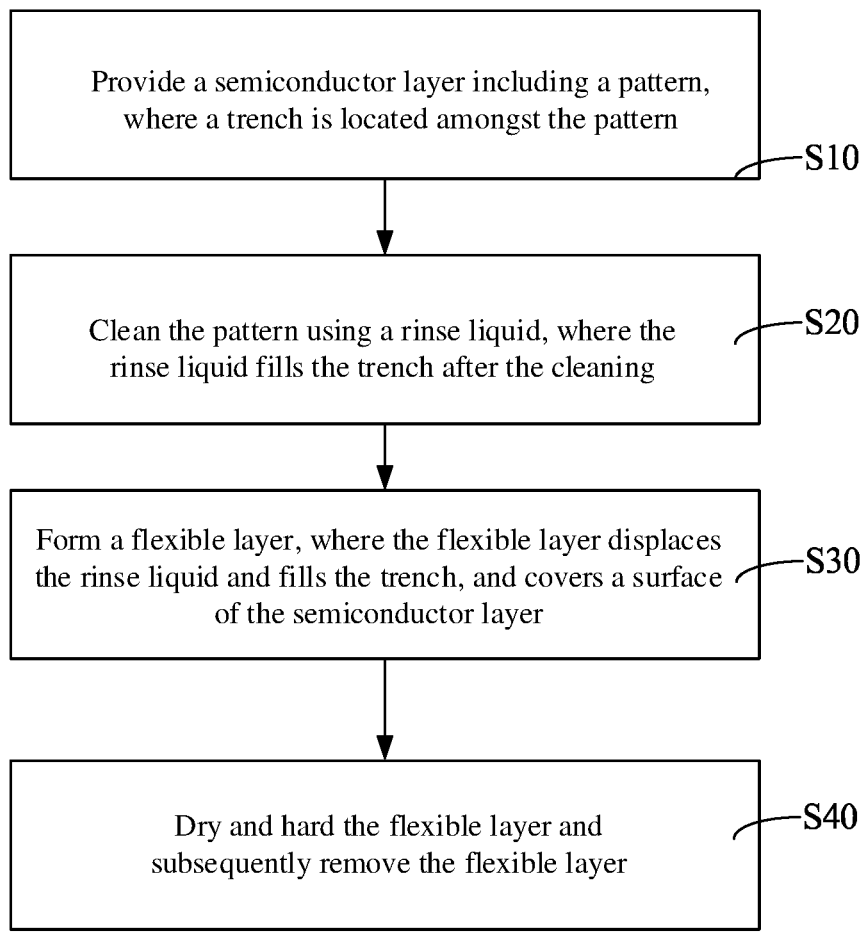
FIG. 2 illustrates a method of processing semiconductor structures, according to an embodiment of this application.

FIG. 2 illustrates a method of processing semiconductor structures to address the problems discussed above, according to an embodiment of this application. The method includes the following steps.

At step S10, the method provides a semiconductor layer including a pattern (e.g., the pattern 12 of FIG. 1), where a trench is located amongst the pattern. The semiconductor layer can be any layer made of materials used in semiconductor manufacturing, such as a substrate made of silicon, a p-doped GaAs layer deposited on a substrate, a non-conductive layer made of a non-doped silicon, or an isolation layer made of SiO2. In some embodiments, the pattern and the trench can be portions of a high aspect ratio nanostructure. For example, in some embodiments, the substrate can be a substrate of a DRAM and the high aspect ratio nanostructure can be stacked capacitors of the DRAM. Many variations are possible. Generally speaking, the higher the aspect ratio, the easier the nanostructure will collapse during the manufacturing process. As way of example, a linear nanostructure with an aspect ratio larger than 9 is likely to collapse during the WET cleaning process.

At step S20, the method cleans the pattern using a rinse liquid, where the rinse liquid fills the trench after the cleaning.

At step S30, the method forms a flexible layer, wherein the flexible layer displaces the rinse liquid and fills the trench and covers a surface of the semiconductor layer.

At step S40, the method dries and hardens the flexible layer and subsequently removes the flexible layer.

In the method above, after the pattern is cleaned, the flexible layer is used to displace the rinse liquid. Because the flexible layer fills the trench, during the drying and hardening process, the flexible layer is always located in the trench to support the pattern. In this way, the problems in which patterns on two sides of the trench deform or collapse during the drying process can be mitigated. In the process of removing rinse liquid from the flexible layer through the drying process, the flexible layer gradually hardens, and therefore gradually supports the pattern. As such, in such a manner, there is no need to impose stringent requirements on devices used in supercritical drying processes and no additional surfactants are needed to be added to the rinse liquid, thereby reducing production costs and increasing product yield rates all the while protecting integrity of the pattern.

Figure 3:
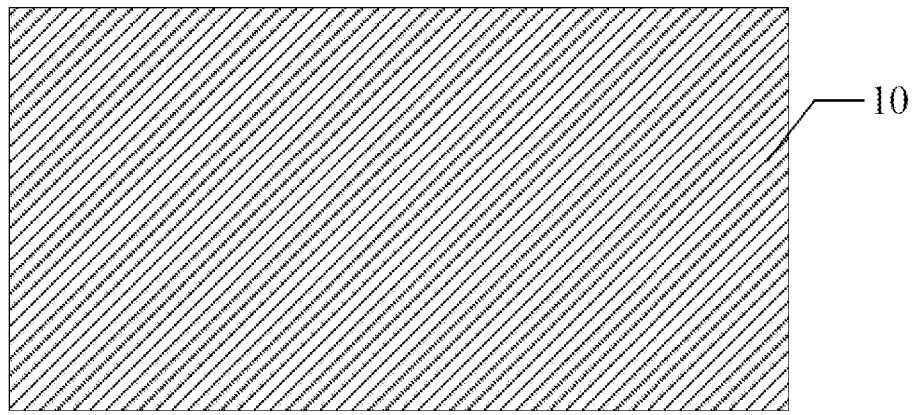
FIGS. 3-6 illustrate a semiconductor layer 10 on which a pattern 12 and a trench 13 are formed, according to an embodiment of this application

FIGS. 3-6 illustrate a semiconductor layer 10 on which a pattern 12 and a trench 13 are formed, according to an embodiment of this application. As shown in FIG. 3, in some embodiments, the semiconductor layer 10 may be a substrate or any to-be-etched semiconductor layer on the substrate. Specifically, in such embodiments, the semiconductor layer 10 may be a substrate such as a wafer and the semiconductor layer 10 may comprise materials such as silicon (Si), germanium (Ge), gallium arsenide (GaAs), indium phosphide (InP), gallium nitride (GaN), and the like.

Figure 4:
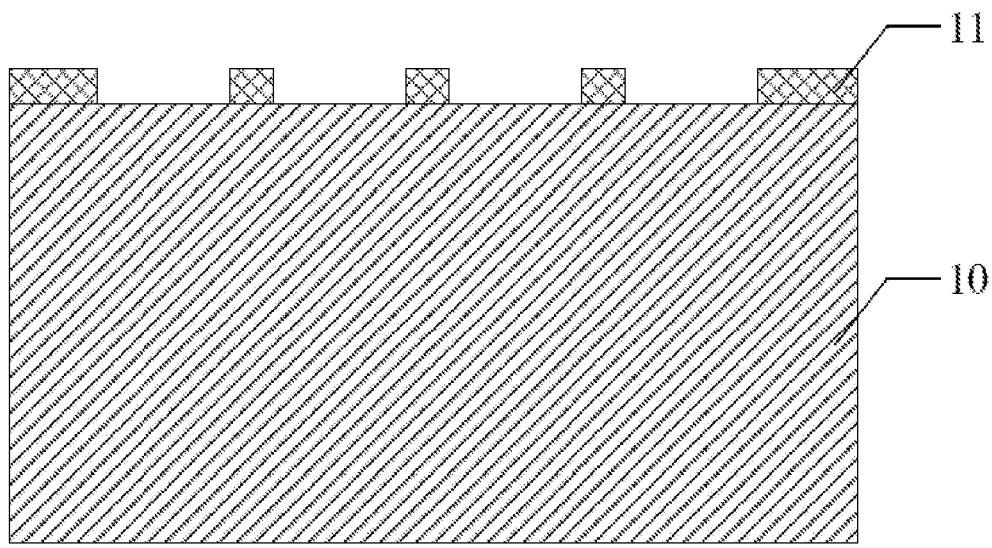

In such embodiments, referring in conjunction with FIG. 2, step S10 of the method may include the following steps: forming a photoresist layer on a surface of the semiconductor layer 10; exposing and developing the photoresist layer to form a patterned mask layer 11 shown in FIG. 4; and etching the semiconductor layer 10 based on the patterned mask layer 11.

Specifically, in such embodiments, the photoresist layer may be formed on the surface of the semiconductor layer 10 through, but unnecessarily, a spin coating process. The photoresist layer is then exposed and developed to remove a part of the photoresist layer that was exposed to obtain the patterned mask layer 11. The patterned mask layer 11 has an opening, and the opening exposes the semiconductor layer 10 and defines a shape and a position of the trench 13 shown in FIG. 5. In some embodiments, the photoresist layer can be spin-coated onto the surface of the semiconductor layer 10 at a spin coating speed ranging from 800 rpm to 1500 rpm. Under such spin coating speeds, the photoresist layer can have a thickness ranging from 400 nm to 800 nm.

After step S10 in which the semiconductor layer 10 is etched through an etching process to form the trench 13, the etching process leaves behind an etching residue in the trench 13, and the method further includes: removing the etching residue through an ashing process.

Figure 5:
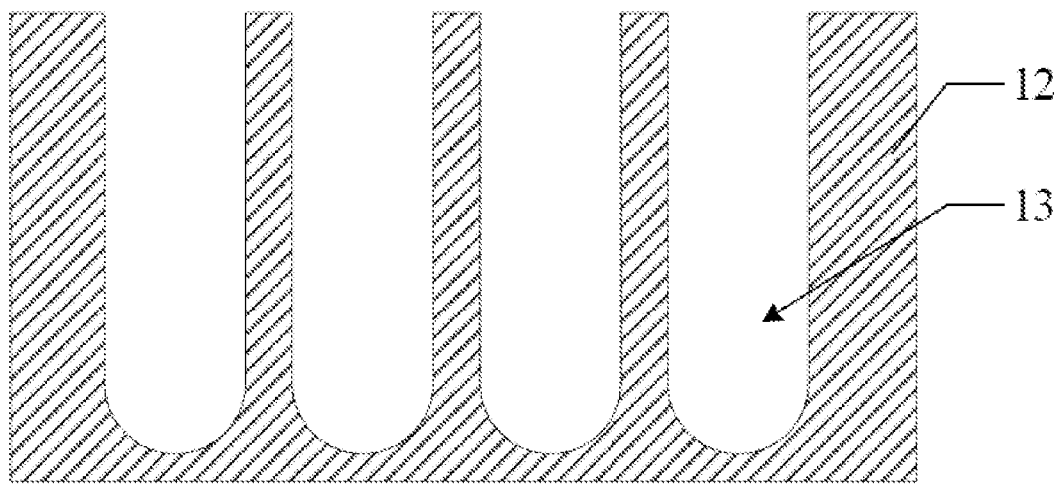

In some embodiments, referring to FIG. 5 in conjunction with FIG. 2, step S20 of the method may include the following steps: cleaning the pattern 12; and drying the pattern 12 using isopropanol (IPA).

Figure 6:
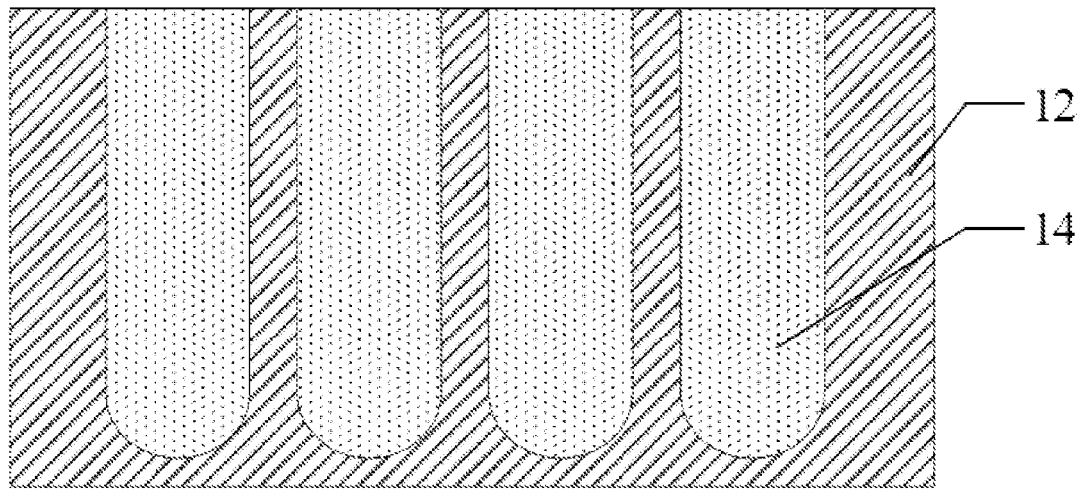

Specifically, cleaning the pattern 12 may include the following: first, organic compounds on surfaces of the pattern 12 and the trench 13 are removed using a high-concentration hydrofluoric (HF) acid solution. Second, the surfaces of the pattern 12 and the trench 13 are cleaned using an SC-1 reagent to generate an oxide layer. This process is intended to repair the surfaces of the pattern 12. In various embodiments, the SC-1 reagent includes ammonia ($NH_4OH$), hydrogen peroxide ($H_2O_2$), and water ($H_2O$). The pattern 12 and the trench 13 are then cleaned using a rinse liquid to remove particles accumulated on the surface of the semiconductor layer 10 during etching. The rinse liquid oxidizes and removes a small quantity of organic compounds and metal contaminants, such as silver and copper, accumulated on the surfaces of the semiconductor layer 10 during etching. In some embodiments, the rinse liquid may be a low-concentration HF acid solution that can remove oxides formed by the SC-1 reagent. In some cases, the rinse liquid can dissolve silicon with the HF acid to clean the surfaces of the semiconductor layer 10 at a temperature ranging from 20° C. to 25° C. to remove oxides formed on the surfaces of the semiconductor layer 10 formed during previous cleaning processes. Particles and metal adsorbed into the oxide layer are removed by the rinse liquid, and a silicon hydrogen bond can be formed on the surfaces of the semiconductor layer 10 (e.g., a silicon semiconductor layer), so that the surfaces of the semiconductor layer 10 becomes hydrophobic. Finally, the surfaces of the pattern 12 and the trench 13 are cleaned using isopropanol 14 and then dried. Specifically, the isopropanol 16 may be sprayed on the surfaces of the semiconductor layer 10. After the step of cleaning the pattern, the trench 13 includes the isopropanol 14, as shown in FIG. 6.

Figure 7:
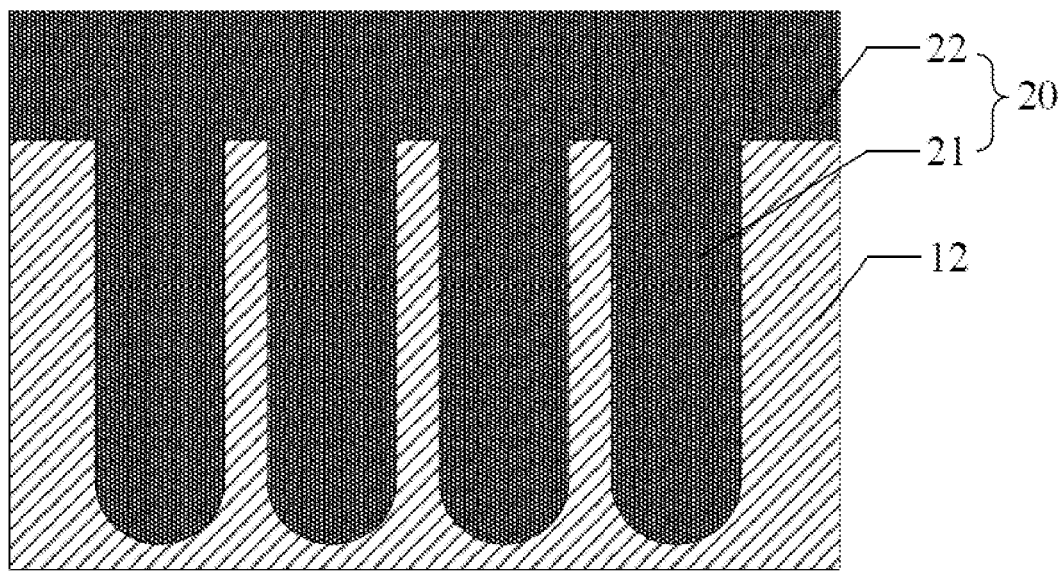
FIG. 7 is a schematic diagram of a section structure obtained after a flexible layer is formed, according to an embodiment of this application.

In some embodiments, as shown in FIG. 7, a flexible layer 20 is formed on the semiconductor layer 10 through spin coating. A spin coating speed of the flexible layer 20 ranges from 800 rpm to 1500 rpm, and may be specifically 800 rpm, 1000 rpm, or 1500 rpm. However, these spin coating speeds are merely provided as examples. In an actual implementation process, a specific value of the spin coating speed of the flexible layer 20 is not limited to such speeds. Specifically, the flexible layer 20 may include but is not limited to a photoresist layer. The flexible layer 20 can be in a soft film shape before being dried, and therefore can be deposited on the surface of the semiconductor layer 10 through spin coating. The flexible layer 20 with a thickness ranging from 400 nm to 1000 nm (specifically, the thickness may be 400 nm, 500 nm, 600 nm, 800 nm, or 1000 nm) may be deposited onto the surface of the semiconductor layer 10 to displace the isopropanol 14. The flexible layer 20 in the soft film shape flows into the trench 13 amongst the pattern 12 and fills the trench 13 amongst the pattern 12.

In some embodiments, the flexible layer 20 can include an upper flexible layer 22 and a lower flexible layer 21. The upper flexible layer 22 and the lower flexible layer 21 may use same materials or may use different materials. The lower flexible layer 21 is formed in the trench 13 amongst the pattern 12, and the upper flexible layer 22 is formed on an upper surface of the pattern 12 and the lower flexible layer 21. To be specific, portions of the flexible layer 20 that flows into the trench 13 amongst the pattern 12 and fills the trench 13 form the lower flexible layer 21, and portions of the flexible layer 20 that does not flow into the trench 13 amongst the pattern 12 and located on the upper surface of the pattern 12 and the lower flexible layer 21 form the upper flexible layer 22.

Figure 8:
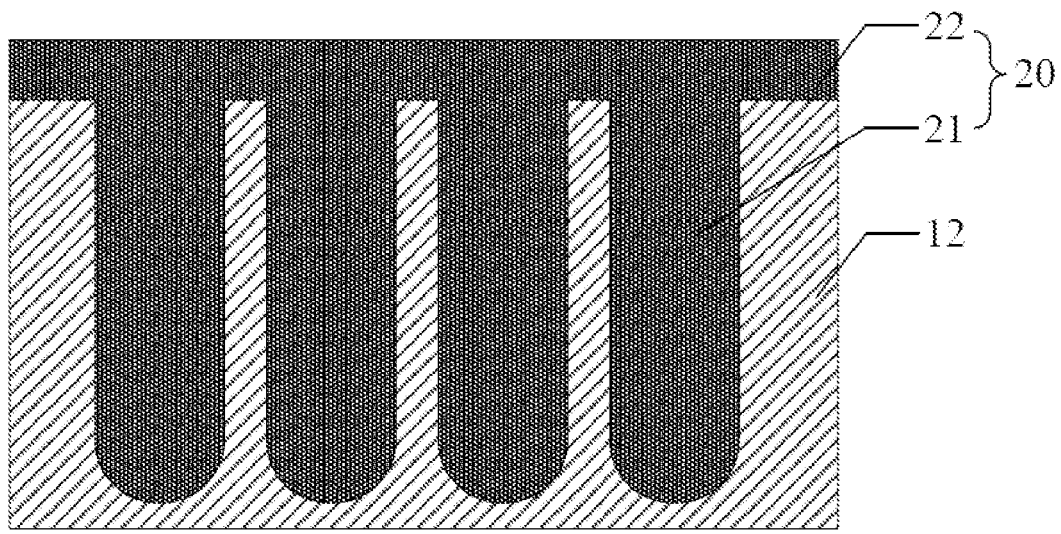
FIG. 8 is a schematic diagram of a section structure obtained after a flexible layer is hardened and dried, according to an embodiment of this application.

In some embodiments, hardening the flexible layer 20 and subsequently removing the flexible layer 20 specifically includes the following steps: drying and hardening the flexible layer 20 through a heating process, as shown in FIG. 8; and removing the flexible layer 20 through an ashing process.

In one implementation, specifically, a drying and hardening temperature may range from 120° C. to 180° C. Water in the flexible layer 20 is evaporated at a temperature ranging from 120° C. to 180° C., such as 120° C., 130° C., 140° C., 150° C., 160° C., 170° C., or 180° C. However, these temperatures are merely provided as examples. In an actual implementation process, a specific value of a heating temperature of the flexible layer 20 is not limited to such temperatures. In some embodiments, the semiconductor layer 10 may be heated using a chuck heater with a temperature ranging from 120° C. to 180° C. to evaporate the water in the flexible layer 20 in the soft film shape to achieve a hardening effect. In the process of evaporating the water, the flexible layer 20 gradually becomes harder, so as to well support the pattern 12, thereby reducing cases in which patterns on two sides of the trench 13 continuously deform or collapse in a drying process because the patterns approach each other under capillary forces.

Figure 9:
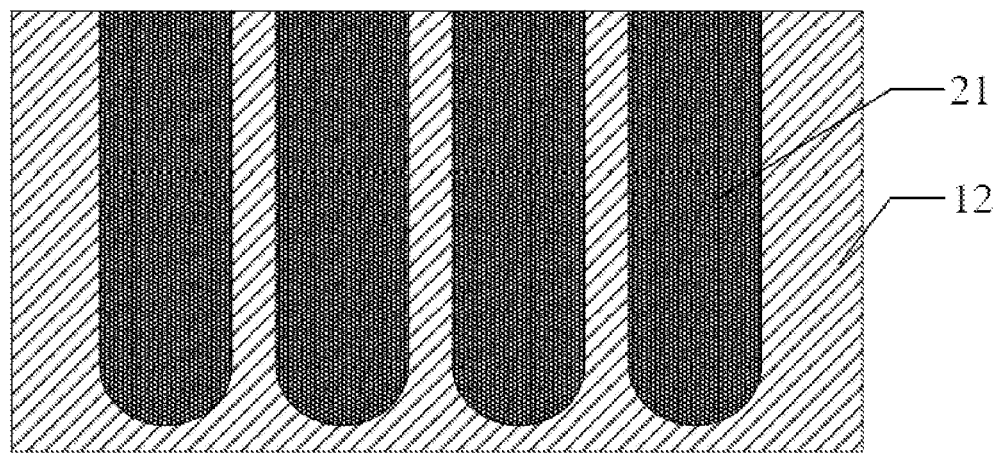
FIG. 9 is a schematic diagram of a section structure obtained after an upper flexible layer is ashed, according to an embodiment of this application.
Figure 10:
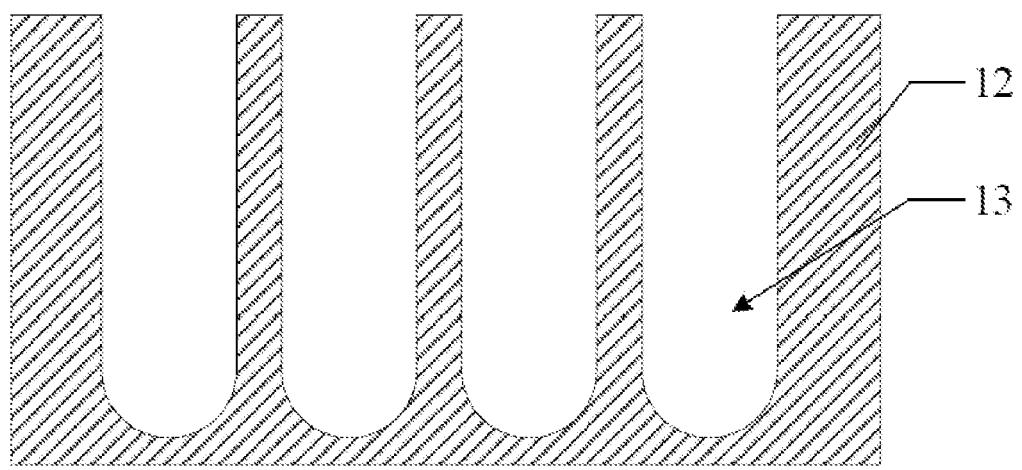
FIG. 10 is a schematic diagram of a section structure obtained after a lower flexible layer is ashed, according to an embodiment of this application.

Removing the flexible layer 20 through an ashing process may include the following steps: removing the upper flexible layer 22 through the ashing process in an oxygen-containing atmosphere, as shown in FIG. 9; and removing the lower flexible layer 21 through the ashing process in an oxygen-free atmosphere, as shown in FIG. 10.

In an example, removing the upper flexible layer 22 through the ashing process in the oxygen-containing atmosphere may include the following steps: obtaining a thickness of the upper flexible layer 22; determining an amount of oxygen required to be contained in an oxygen-containing gas based on the thickness of the upper flexible layer 22; and removing the upper flexible layer 22 through the ashing process using the oxygen-containing gas containing the required amount of oxygen.

In an example, obtaining a thickness of the upper flexible layer 22 may include the following steps: measuring an overall thickness of the flexible layer 20; obtaining a depth of the trench 13; and obtaining the thickness of the upper flexible layer 22 based on the overall thickness of the flexible layer 20 and the depth of the trench 13.

Certainly, any other method that can be used to obtain the thickness of the upper flexible layer 22 may be used herein.

Specifically, the overall thickness of the flexible layer 20 may be obtained by measuring a thickness of a spin-coated soft film by a film thickness machine. Because the depth of the trench 13 is known data, the thickness of the upper flexible layer 22 can be obtained by subtracting the depth of the trench 13 from the thickness of the flexible layer 20, so as to obtain an amount of oxygen required to ash the upper flexible layer 22 with the thickness. The upper flexible layer 22 is removed through the ashing process using an oxygen-containing gas containing the required amount of oxygen. After the upper flexible layer 22 is precisely ashed, the lower flexible layer 21 is removed through the ashing process in the oxygen-free environment using an oxygen-free gas.

In an example, in the process of removing the upper flexible layer 22 through the ashing process, a flow rate of an oxygen-containing gas ranges from 8000 sccm to 15000 sccm, and an ashing time of the ashing process ranges from 10s to 60s. Specifically, the flow rate of the oxygen-containing gas may be 8000 sccm, 9000 sccm, 10000 sccm, 11000 sccm, 12000 sccm, 13000 sccm, 14000 sccm, 1500 sccm, or the like; and the ashing time of the ashing process may be 10s, 20s, 30s, 40s, 50s, 60s, or the like. However, these rates and times are merely provided as examples. In an actual implementation process, a specific value of the flow rate of the oxygen-containing gas and a specific ashing time of the ashing process are not limited to the data.

In an example, the upper flexible layer 22 may be removed in an oxygen-containing atmosphere and then the lower flexible layer 21 is removed in an oxygen-free atmosphere; or a portion of the upper flexible layer 22 may be removed in the oxygen-containing atmosphere and then the remaining portion upper flexible layer 22 and the lower flexible layer 21 are removed in the oxygen-free atmosphere.

In another example, the upper flexible layer 22 and the lower flexible layer 21 may be removed in the oxygen-free atmosphere. However, in some cases, it may take a relatively long time to remove the upper flexible layer 22 and the lower flexible layer 21 in the oxygen-free atmosphere, which seriously affects a production capacity. On the contrary, if the upper flexible layer 22 located on the semiconductor layer 10 is removed through the ashing process in the oxygen-containing atmosphere, and then the lower flexible layer 21 is removed in the oxygen-free atmosphere, the production capacity can be greatly increased and oxidation of the semiconductor layer 10 can be avoided because a speed at which the upper flexible layer 22 is removed in the oxygen-containing atmosphere is 10 to 20 times of a speed at which the lower flexible layer 21 is removed in the oxygen-free atmosphere.

In the step of removing the lower flexible layer 21 through the ashing process in the oxygen-free atmosphere, the oxygen-free atmosphere includes at least one of a hydrogen atmosphere, a nitrogen atmosphere, or a mixture of hydrogen and nitrogen atmospheres. In the process of removing the lower flexible layer 21 through the ashing process in the oxygen-free atmosphere, a flow rate of the oxygen-free gas may range from 8000 sccm to 15000 sccm, and may be specifically 8000 sccm, 9000 sccm, 10000 sccm, 11000 sccm, 12000 sccm, 13000 sccm, 14000 sccm, 15000 sccm, or the like. These flow rates are merely provided as examples. In an actual implementation process, a specific value of the flow rate of the oxygen-free gas is not limited to such flow rates.

The flexible layer 20 remaining in the trench 13 (e.g., a nanostructured trench) with a high aspect ratio is removed through the ashing process in the oxygen-free environment to implement a nanostructure with a high aspect ratio that cannot collapse.

This application further provides a semiconductor structure manufacturing method, including the following steps: providing a semiconductor layer; performing patterning processing on the semiconductor layer to form a pattern on the semiconductor layer 10, where a trench is located amongst the pattern; and processing the semiconductor layer based on the semiconductor structure processing method according to any one of the foregoing embodiments.

In some embodiments, a semiconductor structure manufacturing method specifically includes the following steps: providing a semiconductor layer; performing patterning processing on the semiconductor layer to form a pattern on the semiconductor layer, where a trench is located amongst the pattern; cleaning the pattern using a rinse liquid, wherein the rinse liquid fills the trench after the cleaning; forming a flexible layer, where the flexible layer displaces the rinse liquid and fills the trench, and covers a surface of the semiconductor layer; and drying and hardening the flexible layer and subsequently removing the flexible layer.

In the manufacturing procedure in this application, in the drying process after the surface of the semiconductor layer is cleaned using the rinse liquid, unlike in the prior art in which the pattern continuously deforms or collapses because the pattern is subject to attractive and repulsive forces of molecules in fluids in various directions, in this application, before the drying process, the flexible layer is used to fill the trench amongst the pattern, and the surface of the semiconductor layer is dried while water in the flexible layer is evaporated. In addition, the flexible layer becomes harder in the drying process, and the hardened flexible layer supports the pattern, thereby greatly reducing a probability of deformation or collapse of the pattern. The pattern is usually in a line shape, a cylindrical shape, a cubic shape, or the like. Generally, the pattern in a line shape usually has the strongest anti-collapse capability, the pattern in a cubic shape has the second strongest anti-collapse capability, and the pattern in a cylindrical shape has the weakest anti-collapse capability. However, in this application, because the flexible layer is a soft film when being spin-coated on the semiconductor layer, the flexible layer fills the trench amongst the pattern regardless of a shape of the pattern. Even if the pattern in the cylindrical shape that is most prone to collapse is not easy to collapse due to support of the flexible layer, thereby greatly increasing a yield and a yield rate. In the semiconductor cleaning and drying method provided in this application, the process is simple, there is no need to impose a high requirement on a device as in a supercritical drying process, and no additional surfactants need to be added to the rinse liquid, thereby reducing production costs and increasing a product yield rate while protecting integrity of the pattern.

The technical features in the foregoing embodiments may be combined in any manner. For brevity of description, not all possible combinations of the technical features in the foregoing embodiments are described. However, combinations of the technical features all shall fall within the scope of the specification as long as there is no contradiction between the combinations.

The foregoing embodiments merely describe several implementations of this application, and description of the implementations is relatively specific and detailed, but shall not be understood as a limitation on the scope of this application. It should be noted that a person of ordinary skill in the art may make several variations and improvements without departing from the idea of this application and the variations and improvements shall fall within the protection scope of this application. Therefore, the protection scope of this application shall be subject to the protection scope of the claims.

What is claimed is:

1. A semiconductor structure processing method, comprising:
    providing a semiconductor layer comprising a pattern, wherein a trench is located amongst the pattern;
    cleaning the pattern using a rinse liquid, wherein the rinse liquid fills the trench after the cleaning;
    forming a flexible layer, wherein the flexible layer displaces the rinse liquid and fills the trench, and covers a surface of the semiconductor layer, and the flexible layer comprises an upper flexible layer and a lower flexible layer, wherein the lower flexible layer is formed in the trench, and the upper flexible layer is formed on an upper surface of the pattern and the lower flexible layer; and
    hardening the flexible layer and subsequently removing the flexible layer through an ashing process, wherein removing the flexible layer comprises:
    removing the upper flexible layer through the ashing process in an oxygen-containing atmosphere; and
    removing the lower flexible layer through the ashing process in an oxygen-free atmosphere.

2. The semiconductor structure processing method according to claim 1, wherein providing the semiconductor layer comprising the pattern comprises:
    forming a photoresist layer on the surface of the semiconductor layer;
    exposing and developing the photoresist layer to form a patterned mask layer; and
    etching the semiconductor layer based on the patterned mask layer.

3. The semiconductor structure processing method according to claim 2, before cleaning the pattern, further comprising:
    removing an etching residue through the ashing process.

4. The semiconductor structure processing method according to claim 1, wherein hardening the flexible layer comprises:
    hardening the flexible layer through a heating process.

5. The semiconductor structure processing method according to claim 1, wherein the oxygen-free atmosphere comprises at least one of a hydrogen atmosphere, a nitrogen atmosphere, or a mixture of hydrogen and nitrogen atmospheres, and the lower flexible layer is removed through the ashing process in the oxygen-free atmosphere.

6. The semiconductor structure processing method according to claim 1, wherein removing the upper flexible layer through the ashing process in the oxygen-containing atmosphere further comprises:
    obtaining a thickness of the upper flexible layer;
    determining an amount of oxygen required to be contained in an oxygen-containing gas based on the thickness of the upper flexible layer; and
    removing the upper flexible layer through the ashing process using the oxygen-containing gas containing the required amount of oxygen.

7. The semiconductor structure processing method according to claim 6, wherein obtaining the thickness of the upper flexible layer further comprises:
    measuring an overall thickness of the flexible layer;
    obtaining a depth of the trench; and
    obtaining the thickness of the upper flexible layer based on the overall thickness of the flexible layer and the depth of the trench.

8. The semiconductor structure processing method according to claim 6, wherein removing the upper flexible layer through the ashing process using the oxygen-containing gas containing the required amount of oxygen further comprises: a flow rate of the oxygen-containing gas ranges from 8000 sccm to 15000 sccm, and an ashing time of the ashing process ranges from 10s to 60s.

9. The semiconductor structure processing method according to claim 1, wherein cleaning the pattern using the rinse liquid comprises:
    cleaning the pattern; and
    drying the pattern using isopropanol, wherein
    the rinse liquid filled in the trench is the isopropanol.

10. The semiconductor structure processing method according to claim 1, wherein forming the flexible layer comprises:
    forming the flexible layer on the semiconductor layer through spin coating, wherein a spin coating speed of the flexible layer ranges from 800 rpm to 1500 rpm.

11. The semiconductor structure processing method according to claim 1, wherein the semiconductor layer is selected from a group consisting of a substrate, a conductive or semi-conductive layer made of a doped semiconductor material, a non-conductive layer made of a non-doped semiconductor material, and an isolation layer.

12. The semiconductor structure processing method according to claim 1, wherein the pattern and the trench comprise an aspect ratio of larger than 9.

13. A semiconductor structure manufacturing method, comprising:
    providing a semiconductor layer;
    performing patterning processing on the semiconductor layer to form a pattern on the semiconductor layer, wherein a trench is located amongst the pattern;
    cleaning the pattern using a rinse liquid, wherein the rinse liquid fills the trench after the cleaning;
    forming a flexible layer, wherein the flexible layer displaces the rinse liquid and fills the trench, and covers a surface of the semiconductor layer, and the flexible layer comprises an upper flexible layer and a lower flexible layer, wherein the lower flexible layer is formed in the trench, and the upper flexible layer is formed on an upper surface of the pattern and the lower flexible layer; and
    hardening the flexible layer and subsequently removing the flexible layer through an ashing process, wherein removing the flexible layer comprises:
    removing the upper flexible layer through the ashing process in an oxygen-containing atmosphere; and
    removing the lower flexible layer through the ashing process in an oxygen-free atmosphere.

14. The semiconductor structure manufacturing method according to claim 13, wherein the patterning processing is performed on the semiconductor layer through an etching process, wherein the etching process leaves behind an etching residue in the trench after the etching process, further comprising: removing the etching residue through an ashing process before cleaning the pattern.

15. The semiconductor structure manufacturing method according to claim 13, wherein the semiconductor layer is selected from a group consisting of a substrate, a conductive or semi-conductive layer made of a doped semiconductor material, a non-conductive layer made of a non-doped semiconductor material, and an isolation layer.

16. The semiconductor structure manufacturing method according to claim 13, wherein the pattern and the trench comprise an aspect ratio of larger than 9.

17. The semiconductor structure manufacturing method according to claim 13, wherein the oxygen-free atmosphere comprises at least one of a hydrogen atmosphere, a nitrogen atmosphere, or a mixture of hydrogen and nitrogen atmospheres, and the lower flexible layer is removed through the ashing process in the oxygen-free atmosphere.

18. The semiconductor structure manufacturing method according to claim 13, wherein removing the upper flexible layer through the ashing process in the oxygen-containing atmosphere further comprises:
   obtaining a thickness of the upper flexible layer;
   determining an amount of oxygen required to be contained in an oxygen-containing gas based on the thickness of the upper flexible layer; and
   removing the upper flexible layer through the ashing process using the oxygen-containing gas containing the required amount of oxygen.

19. The semiconductor structure manufacturing method according to claim 13, wherein cleaning the pattern using the rinse liquid comprises:
   cleaning the pattern; and
   drying the pattern using isopropanol, wherein
   the rinse liquid filled in the trench is the isopropanol.

20. The semiconductor structure manufacturing method according to claim 13, wherein forming the flexible layer comprises:
   forming the flexible layer on the semiconductor layer through spin coating, wherein a spin coating speed of the flexible layer ranges from 800 rpm to 1500 rpm.

* * * * *